(12) United States Patent
Shiiki et al.

(10) Patent No.: US 6,534,827 B2
(45) Date of Patent: Mar. 18, 2003

(54) MOS TRANSISTOR

(75) Inventors: Mika Shiiki, Chiba (JP); Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/808,068

(22) Filed: Mar. 14, 2001

(65) Prior Publication Data

US 2001/0030345 A1 Oct. 18, 2001

(30) Foreign Application Priority Data

Mar. 22, 2000 (JP) ........................ 2000-080726
May 30, 2000 (JP) ........................ 2000-160477
Jan. 11, 2001 (JP) ........................ 2001-004061

(51) Int. Cl.[7] ............................................. H01L 29/76
(52) U.S. Cl. .................. 257/336; 257/327; 257/335; 257/337; 257/344; 257/346; 438/276; 438/217
(58) Field of Search ................ 257/327, 329, 257/336, 334, 379, 529; 438/276, 289, 217

(56) References Cited

U.S. PATENT DOCUMENTS 5,903,027 A * 5/1999 Yoshitomi et al. .......... 257/327
6,306,709 B1 * 10/2001 Miyagi et al. ............... 257/404

* cited by examiner

Primary Examiner—David Nelms
Assistant Examiner—Mai-Huong Tran
(74) Attorney, Agent, or Firm—Adams & Wilks

(57) ABSTRACT

Ion implantation is conducted using contact holes of a MOS transistor as a mask to form high concentration diffusion regions, whereby a MOS transistor having a medium withstand voltage structure is provided, in which a high drain withstand voltage, a small capacitance between a source/drain region and a gate electrode, and a high junction withstand voltage between a source/drain region and a channel stop region under a field oxide film are obtained, and the drain withstand voltage can be controlled. Low impurity concentration source and drain regions of a second conductivity type are formed in a semiconductor substrate surrounded by a field oxide film and a gate electrode. An interlayer insulating film is formed thereover for electrically insulating a gate electrode and the source and drain regions. A wiring layer is formed on the interlayer insulating film. A pair of contact holes are formed to extend through the interlayer insulating film to expose a portion of the source and drain regions for electrically connecting the wiring layer, the gate electrode, and the source and drain regions, and high impurity concentration diffusion layers of the second conductivity type are formed only in the exposed portion of each of the source and drain regions.

20 Claims, 13 Drawing Sheets

MOS TRANSISTOR

BACKGROUND OF THE INVENTION

1. Field of the Invention

The present invention relates to a semiconductor device and a method of manufacturing the same. In particular, the present invention relates to a MOS transistor having a medium withstand voltage structure with a withstand voltage of 8 to 30 volts.

2. Description of the Related Art

Conventionally, as shown in FIG. 11, a lightly doped drain ("LDD") structure is known, which is composed of a gate oxide film 102 and a polycrystalline silicon gate electrode 104 having side spacers 103 on both sides, formed on a silicon semiconductor substrate 101, low-concentration diffusion layers 105 formed on the surface of the substrate 101, positioned below the side spacers 103, high concentration diffusion layers 106 called a source and a drain formed on the surface of the substrate 101 on both sides of the gate electrode 104, and a channel region 107 between the source and the drain.

A MOS transistor having the above-mentioned conventional LDD structure has the following problems. The width of each side spacer is very small, and hence, the width of each impurity concentration region (i.e., the low-concentration diffusion layer 105) is also small, so that a withstand voltage of 8 to 30 volts cannot be obtained. Furthermore, the capacitance between the source/drain region and the gate electrode cannot be decreased. The ends of the source and drain regions (i.e., the high impurity concentration regions) are terminated at field oxide films, so that a junction withstand voltage between the source/drain region and a channel stop layer under the field oxide film is also low. Still furthermore, it is difficult to form MOS transistors having a plurality of withstand voltages on the identical substrate.

SUMMARY OF THE INVENTION

Therefore, with the foregoing in mind, it is an object of the present invention to provide a plurality of medium withstand voltage MOS transistors having different withstand voltages of 8 to 30 volts on the identical substrate by a simple process without increasing the number of masks to be used, wherein a high drain withstand voltage, a small capacitance between a source/drain region and a gate electrode, and a high junction withstand voltage between a channel stop layer under a field oxide film and a source/drain region can be obtained (which cannot be achieved by a MOS transistor having a conventional LDD structure), and the drain withstand voltage can be controlled In order to achieve the above-mentioned object, the following means are used in the present invention.

(1) The semiconductor device is characterized by including: a field oxide film formed on a semiconductor substrate of one conductivity; a gate electrode formed on the semiconductor substrate via a gate oxide film; source and drain regions of reverse conductivity with low concentration, surrounded by the field oxide film and the gate electrode; an interlayer film for electrically insulating the gate electrode, the source and drain regions, and a wiring formed thereon; and a contact hole for electrically connecting the wiring, the gate electrode, and the source and drain regions, wherein only a portion of the source and drain regions opened to the contact hole is selectively formed into a diffusion layer of reverse conductivity with high concentration.

(2) The semiconductor device is characterized in that an impurity concentration of the source and drain regions is 1E16 to 1E18 atoms/cm$^3$.

(3) The semiconductor device is characterized in that an impurity concentration of the diffusion layer is 1E19 to 5E20 atoms/cm$^3$.

(4) The semiconductor device is characterized in that a width of the source and drain regions is varied by changing a distance between one end of the gate electrode and one end of the diffusion layer, whereby a plurality of MOS transistors having different withstand voltages are formed on an identical substrate.

(5) The method of manufacturing a MOS transistor having an medium withstand voltage structure is characterized by including the steps of: forming a gate insulating film on a surface of a semiconductor substrate; patterning a gate electrode on the gate insulating film; forming a low concentration diffusion region by ion-implanting impurities into the surface of the semiconductor substrate, using the gate electrode as a mask; forming an interlayer film containing impurities over an entire surface of the semiconductor substrate, and flattening the interlayer film by heat treatment; selectively etching the interlayer film to form contact holes in the low concentration diffusion region and the gate electrode; forming a high concentration diffusion region by ion-implanting impurities into the surface of the semiconductor substrate, using the contact hole as a mask; conducting heat treatment; forming a metal material over an entire surface of the semiconductor substrate by vacuum evaporation or sputtering, and then patterning the metal material by photolithography and etching; and covering an entire surface of the semiconductor substrate with a surface protective film.

(6) The method is characterized in that the interlayer film containing impurities is a BPSG interlayer film.

(7) The method is characterized in that the heat treatment after implanting the impurities into the surface of the semiconductor substrate is conducted at 800° C. to 1050° C. within 3 minutes so as to activate the impurities, whereby the high concentration diffusion region is formed.

(8) The method of manufacturing a MOS transistor is characterized by including the steps of: forming a gate insulating film on a surface of a semiconductor substrate; patterning a gate electrode on the gate insulating film; forming a low concentration diffusion region by ion-implanting impurities into the surface of the semiconductor substrate, using the gate electrode as a mask; forming an interlayer film containing impurities over an entire surface of the semiconductor substrate, and flattening the interlayer film by heat treatment; selectively etching the interlayer film to form contact holes in the low concentration diffusion region and the gate electrode; forming polycrystalline silicon over an entire surface of the semiconductor substrate by a CVD method, and then implanting phosphorus as an impurity element at high concentration by ion implantation or by using an impurity diffusion furnace; patterning the polycrystalline silicon by photolithography and etching; diffusing the impurities in the polycrystalline silicon into the surface of the semiconductor substrate by heat treatment to form a high concentration diffusion region; forming a metal material over an entire surface of the semiconductor substrate by vacuum evaporation or sputtering, and then patterning the metal material by photolithography and etching; and covering an entire surface of the semiconductor substrate with a surface protective film.

(9) The method is characterized in that the interlayer film containing impurities is a BPSG interlayer film.

(10) The method is characterized in that the heat treatment for diffusing the impurities in the polycrystalline silicon is conducted at 800° C. to 1050° C. within 3 minutes so as to activate the impurities, whereby the high concentration diffusion region is formed.

(11) The semiconductor device is characterized by including: a field oxide film formed on a semiconductor substrate of one conductivity; a gate electrode formed on the semiconductor substrate via a gate oxide film; source and drain regions of reverse conductivity, surrounded by the field oxide film and the gate electrode, wherein a concentration profile of the source and drain regions is arbitrarily varied by changing a region where impurities are implanted and a region where impurities are not implanted; an interlayer film for electrically insulating the gate electrode, the source and drain regions, and a wiring formed thereon; and a contact hole for electrically connecting the wiring, the gate electrode, and the source and drain regions.

(12) The semiconductor device is characterized in that an impurity concentration of the source and drain regions is 1E16 to 5E20 atoms/cm$^3$.

(13) The semiconductor device is characterized in that the region where impurities are implanted and the region where impurities are not implanted are formed in a dot shape.

(14) The semiconductor device is characterized in that the region where impurities are implanted and the region where impurities are not implanted are formed in a grid shape.

(15) The semiconductor device is characterized in that the region where impurities are implanted and the region where impurities are not implanted are formed in a stripe shape.

(16) The method of manufacturing a MOS transistor having a medium withstand voltage structure is characterized by including the steps of: forming a gate insulating film on a surface of a semiconductor substrate; patterning a gate electrode on the gate insulating film; implanting ions into the surface of the semiconductor substrate by using, as a mask, a photoresist patterned into a region where impurities are implanted and a region where impurities are not implanted, followed by conducting heat treatment, thereby simultaneously forming at least two regions of different impurity concentrations; forming an interlayer film containing impurities over an entire surface of the semiconductor substrate, and flattening the interlayer film by heat treatment; selectively etching the interlayer film to form contact holes in the low concentration diffusion region and the gate electrode; conducting heat treatment; forming a metal material over an entire surface of the semiconductor substrate by vacuum evaporation or sputtering, and then patterning the metal material by photolithography and etching; and covering an entire surface of the semiconductor substrate with a surface protective film.

(17) The method is characterized in that the region where impurities are implanted and the region where impurities are not implanted are formed in a dot shape.

(18) The method is characterized in that the region where impurities are implanted and the region where impurities are not implanted are formed in a grid shape.

(19) The method is characterized in that the region where impurities are implanted and the region where impurities are not implanted are formed in a stripe shape.

(20) The method is characterized in that the interlayer film containing impurities is a BPSG interlayer film.

(21) The method is characterized in that the heat treatment after implanting the impurities into the surface of the semiconductor substrate is conducted at 800° C. to 1050° C. within 3 minutes so as to activate the impurities.

These and other advantages of the present invention will become apparent to those skilled in the art upon reading and understanding the following detailed description with reference to the accompanying figures.

DESCRIPTION OF THE PREFERRED EMBODIMENTS

According to the semiconductor device of the present invention, there is provided a plurality of MOS transistors that have different withstand voltages so as to be suitable for an operation at 8 to 30 volts on the identical substrate without increasing the number of masks to be used, wherein a high drain withstand voltage, a small capacitance between a source/drain region and a gate electrode, and a high junction withstand voltage between a channel stop layer under a field oxide film and a source/drain region can be obtained, and the drain withstand voltage can be controlled.

Hereinafter, the present invention will be described by way of illustrative examples with reference to the drawings.

EXAMPLE 1

Figure 1:
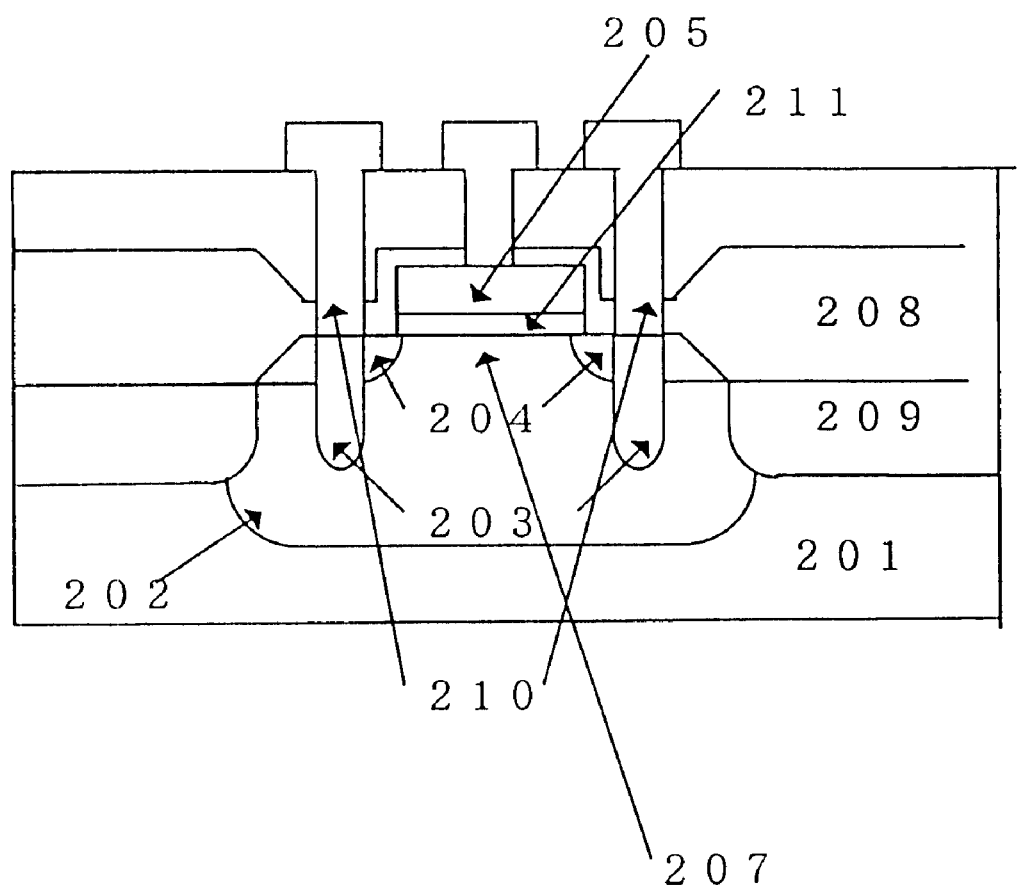
FIG. 1 is a schematic cross-sectional view of a P-channel MOS transistor, showing the first example of a semiconductor device according to the present invention.

The first example of a semiconductor device according to the present invention will be described in detail. FIG. 1 is a schematic cross-sectional view of a P-channel MOS transistor having a medium withstand voltage structure of the semiconductor device according to the present invention.

The P-channel MOS transistor is composed of a gate oxide film 211 and a polycrystalline silicon gate electrode 205 formed on an N-type well region 202 on a P-type silicon semiconductor substrate 201, P-type diffusion layers 204 of low concentration formed in the substrate 201 on both sides of the gate electrode 205 and $P^+$-type diffusion layers 203 of high concentration selectively formed by using contact holes 210 as a mask, and a channel region 207 between the P-type diffusion layers 204. In order to provide isolation of elements, field oxide films 208 and channel stop regions 209 are formed. It is not necessarily required to form an N-type well region, using a P-type silicon semiconductor substrate. A P-channel MOS transistor may be formed on an N-type silicon semiconductor substrate.

An N-channel MOS transistor of reverse conductivity is composed of, a P-type well region formed in an N-type silicon semiconductor substrate, a gate oxide film and a polycrystalline silicon gate electrode formed on the P-type well region, N-type diffusion layers of low concentration and $N^+$-type diffusion layers of high concentration on both sides of the gate electrode formed in a silicon substrate on both ends of a gate electrode, and a channel region between the N-type diffusion layers of low concentration. In order to provide isolation of elements, field oxide films and channel stop regions are formed. It is not necessarily required to use an N-type silicon semiconductor substrate. An N-channel MOS transistor may be formed by using a P-type silicon semiconductor substrate.

As is apparent from FIG. 1, by changing the position of the contact holes, a distance (S1) between one end of the gate electrode and one end of the high concentration diffusion region can be easily changed. Furthermore, by changing the position of the contact holes, a distance (S2) between one end of the high concentration diffusion region and one end of the field oxide film can be easily changed. More specifically, by controlling the widths (S1 and S2) of the low concentration diffusion region and the concentration thereof in accordance with a required drain withstand voltage, a junction withstand voltage between the high concentration diffusion region and the channel stop region under the field oxide film, and an overlap capacitance between the source/drain region and the gate electrode, a MOS transistor suitable for high integration and high speed can be obtained. Furthermore, by changing the distance S1, a plurality of MOS transistors having different withstand voltages can be easily formed on the identical substrate. This will be exemplified with reference to FIGS. 2 and 3.

Figure 2:
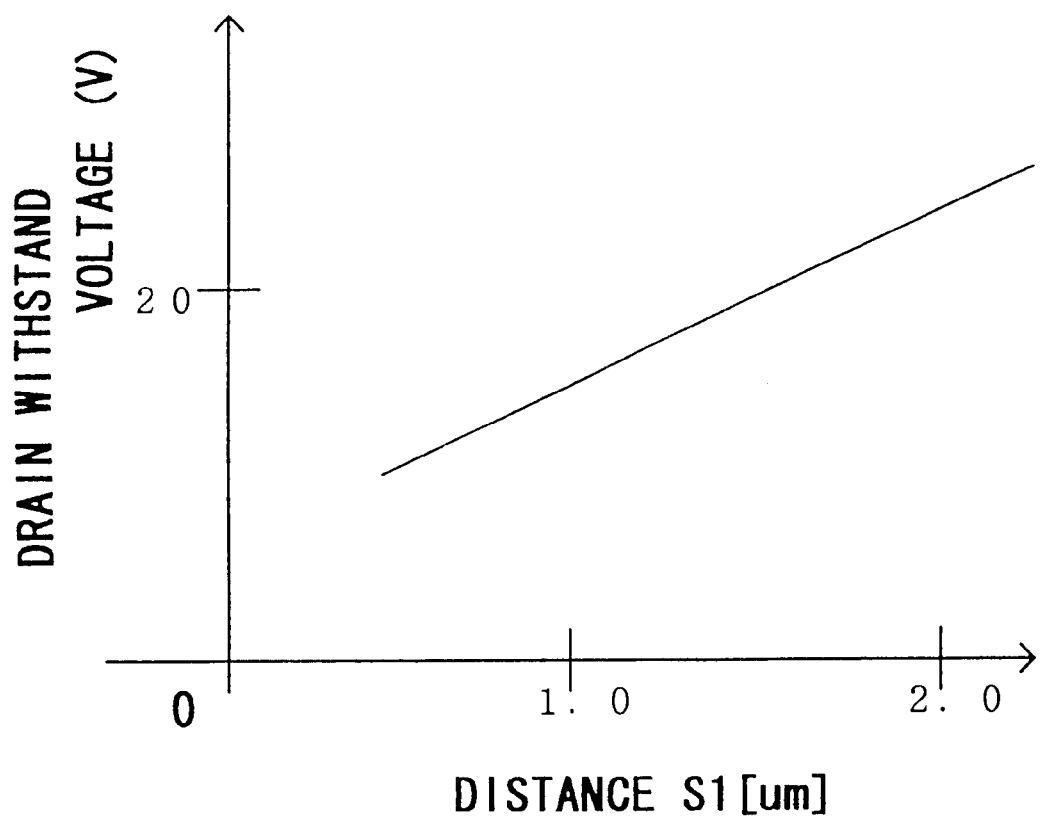
FIG. 2 shows a relationship between the distance (S1) between one end of a gate electrode and one end of a contact hole for a source and a drain, and the drain withstand voltage.

FIG. 2 shows a relationship between the distance (S1) between one end of the gate electrode and one end of the contact hole and the drain withstand voltage, in the case where the low concentration diffusion regions are formed by ion implantation at a dose amount of 2.5E12 atoms/cm$^2$.

It is understood from FIG. 2 that a drain withstand voltage is varied by changing the distance S1. For example, when a MOS transistor of S1=1.0 μm and a MOS transistor of S1=2 μm are formed on the identical substrate, MOS transistors having different withstand voltages (i.e., a MOS transistor of 15 volts and a MOS transistor of 22 volts) can be formed on the identical substrate. Furthermore, by changing the concentrations of the low concentration region and the high concentration region, a drain withstand voltage can be easily changed.

Figure 3:
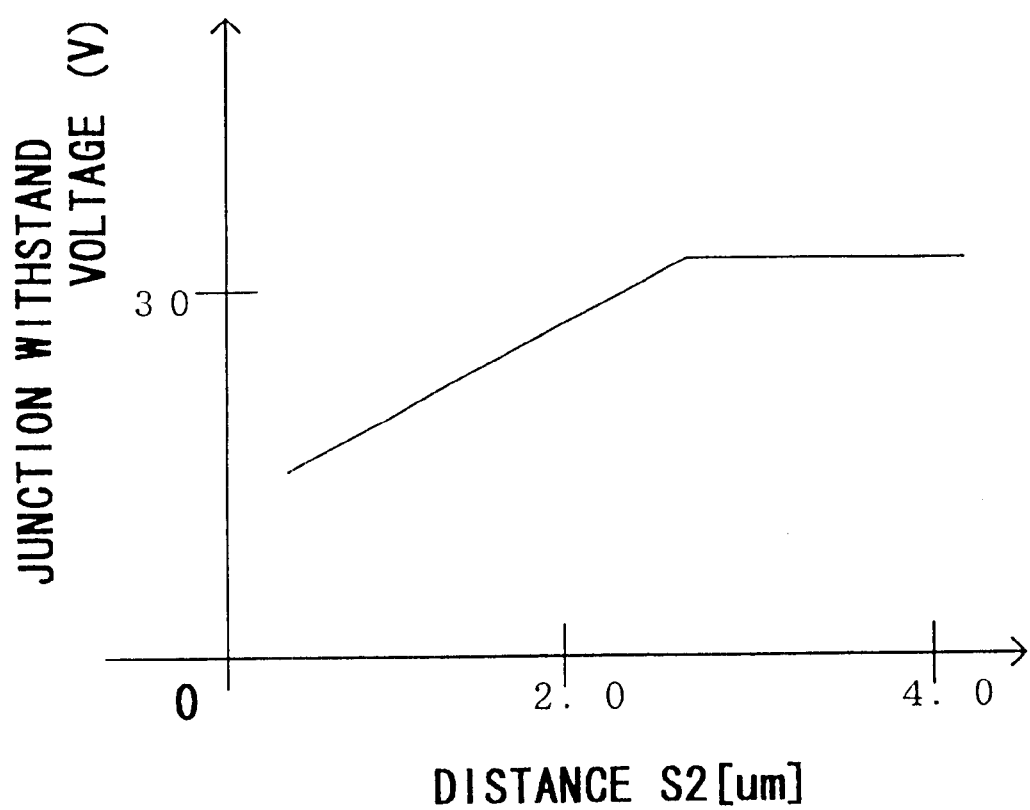
FIG. 3 shows a relationship between the distance (S1) between one end of a channel stop layer under a field oxide film and one end of a contact hole for a source and a drain, and the junction withstand voltage.

Furthermore, FIG. 3 shows a relationship between the distance (S2) between one end of the high concentration diffusion region and one end of the field oxide film and the junction withstand voltage between the high concentration diffusion region and the channel stop region under the field oxide film.

It is understood from FIG. 3 that a junction withstand voltage is easily varied by changing the distance S2. Furthermore, by changing the concentrations of the channel stop region, the low concentration diffusion region, and the high concentration diffusion region, a junction withstand voltage can be easily changed.

FIGS. 4A to 4H are cross-sectional views illustrating the steps of a method of manufacturing the P-channel MOS transistor in the first example of the semiconductor device according to the present invention.

Figure 4A:
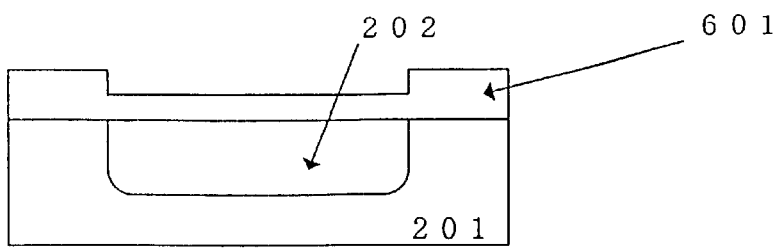
FIGS. 4A to 4H are cross-sectional views illustrating the steps of a method of manufacturing the P-channel MOS transistor shown in the first example of the semiconductor device according to the present invention.

In the step shown in FIG. 4A, the N-type well layer 202 is formed on the surface of the P-type silicon semiconductor substrate 201. A silicon nitride film 601 patterned to a predetermined shape is formed as a mask on the surface of the substrate 201, and then, N-type impurities (e.g., phosphorus) are ion-implanted at a dose amount of 2E12 atoms/cm$^2$. Thereafter, so-called LOCOS (localized oxidation of silicon) processing is conducted to remove the silicon nitride film 601 formed in the previous step. Then, the resultant substrate 201 is subjected to heat treatment at 1150° C. for 6 hours, whereby the implanted phosphorus impurities are diffused and activated to form the N-type well layer 202 as shown in FIG. 4A. A P-channel MOS transistor will be formed in the N-type well layer 202. It is not necessarily required to use a P-type silicon semiconductor substrate. It may also be possible that an N-type well region is formed by using an N-type silicon semiconductor substrate, and a P-channel MOS transistor is formed in the N-type well region. Alternatively, a P-channel MOS transistor may be formed in an N-type silicon semiconductor substrate.

Figure 4B:
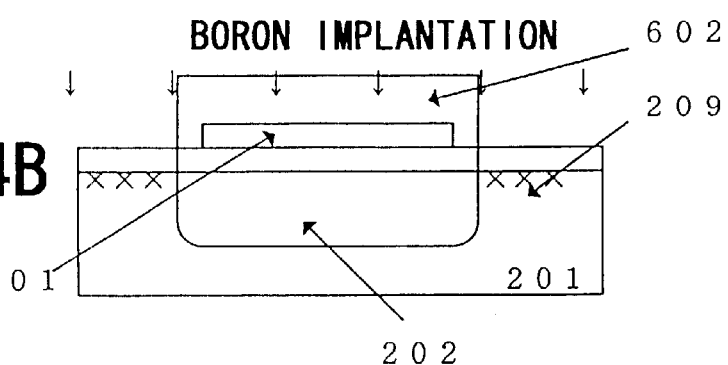

In the step shown in FIG. 4B, the channel stop regions 209 are formed. First, a silicon nitride film 601 is patterned so as to cover an active region where a transistor element is to be formed. On the N-type well layer 202, a photoresist 602 as well as the silicon nitride film 601 are stacked on top of the other. In this state, impurities (boron) are ion-implanted at an acceleration energy of 30 keV and a dose amount of 2E13 atoms/cm$^2$, thereby forming the channel stop regions 209. As shown in FIG. 4B, the channel stop regions 209 are formed in portions including an element region.

Figure 4C:
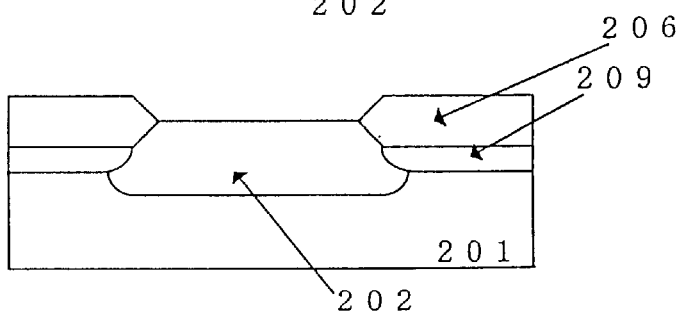

Subsequently, as shown in FIG. 4C, so-called LOCOS processing is conducted to form field oxide films 206 so as to surround the element region. Thereafter, sacrificial sacrificing oxidation and removal processing are conducted, whereby foreign matter remaining on the surface of the substrate is removed for cleaning.

Figure 4D:
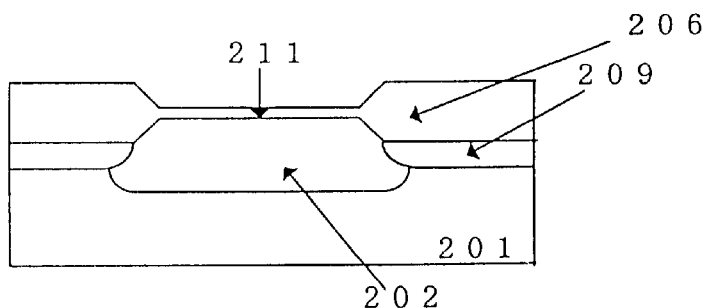

In the step shown in FIG. 4D, a gate oxide film 211 is formed in a H$_2$O atmosphere by thermal oxidation processing of the surface of the resultant substrate 201. According to the present invention, thermal oxidation processing is conducted in a $H_2O$ atmosphere at 860° C. to form the gate oxide film 211 with a thickness of about 300 Å. In general, in order to ensure the reliability of a semiconductor device, the thickness of a gate insulating film formed of a thermal oxide film needs to be set at about 3 MV/cm. For example, a MOS transistor with a supply voltage of 30 volts requires an oxide film with a thickness of 1000 Å or more.

Figure 4E:
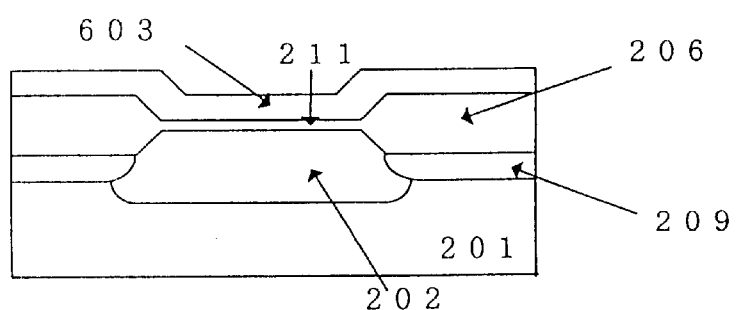

Then, as shown in FIG. 4E, polycrystalline silicon 603 is deposited on the gate oxide film 211 by a CVD (chemical-vapor deposition) method. According to the present invention, polycrystalline silicon with a thickness of 4000 Å is formed. In order to form the gate electrode 205 for a MOS transistor, the polycrystalline silicon 603 is made into an N-type. Impurity elements (phosphorus) are implanted at high concentration into the polycrystalline silicon 603 by ion implantation or by using an impurity diffusion furnace. The implantation concentration is set to be ion implantation/polycrystalline silicon thickness=2E19 atoms/$cm^3$ or more. The gate electrode for a MOS transistor is not necessarily required to be made into an N-type. It may be possible that impurity elements (boron) are implanted at high concentration by ion implantation or by using an impurity diffusion furnace, whereby the gate electrode is made into a P-type.

Figure 4F:
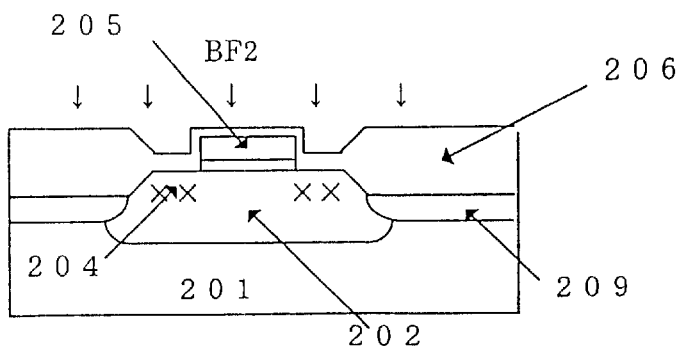

Then, as shown in FIG. 4F, the photoresist formed in the previous step is removed. In this state, P-type impurities (BF2 or boron) are ion-implanted at a dose amount of $1 \times 10^{12}$ to $1 \times 10^{13}$ atoms/$cm^2$ (this corresponds to a concentration of about $1 \times 10^{16}$ to $1 \times 10^{18}$ atoms/$cm^3$) by self-alignment using the gate electrode 205 as a mask, whereby the diffusion layers 204 of low concentration for the P-type MOS transistor is formed.

Figure 4G:
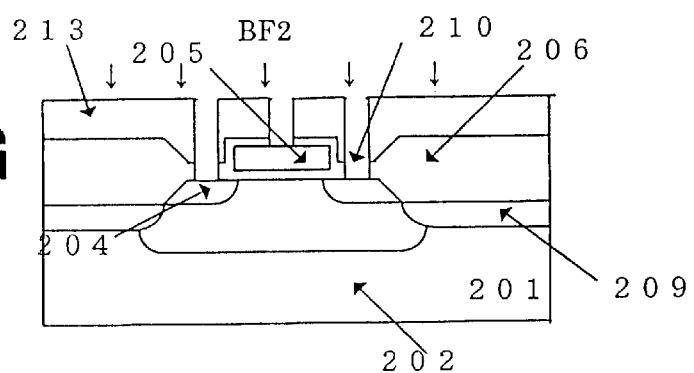

As shown in FIG. 4G, after the diffusion layers 204 of low concentration for the P-channel MOS transistor are formed and the photoresist is removed, for example, a BPSG interlayer film 213 is formed over the entire surface. The interlayer film 213 is formed, for example, by a CVD method. According to the present invention, a multi-layered film of an NSG film of 3000 Å and a BPSG film of 5000 Å are used as the interlayer film. Subsequently, the interlayer film 213 is flattened by heat treatment at about 900° C. to 950° C. for about 30 minutes to 2 hours. Then, the interlayer film 213 is selectively etched to form contact holes 210 in the diffusion regions 204 of low concentration and the gate electrode 205. According to the present invention, the contact holes are formed by round etching (dry etching followed by wet etching). In this state, P-type impurities (BF2) are ion-implanted at a dose amount of $3 \times 10^{15}$ to $5 \times 10^{16}$ atoms/$cm^2$ (this corresponds to a concentration of about $1 \times 10^{19}$ to $5 \times 10^{20}$ atoms/$cm^3$) by self-alignment using the contact holes 210 as a mask. Thereafter, heat treatment is conducted so as to activate the implanted impurities and to improve the shape of the contact holes. According to the present invention, the heat treatment is conducted at 800° C. to 1050° C. within 3 minutes.

Figure 4H:
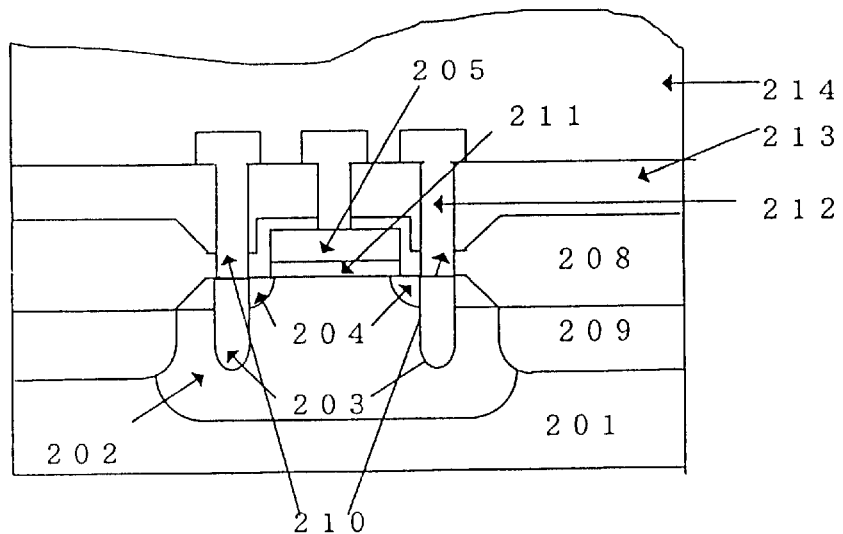

Then, as shown in FIG. 4H, a metal material is formed over the entire surface by vacuum evaporation or sputtering. Thereafter, a patterned metal wiring 212 is formed by photolithography and etching. Finally, the entire surface of the resultant substrate is covered with a surface protective film 214.

The example of P-channel MOS transistor has been exemplified in the above. Even when an N-channel MOS transistor is formed by using impurities of reverse conductivity, similar effects are obtained.

Figure 5A:
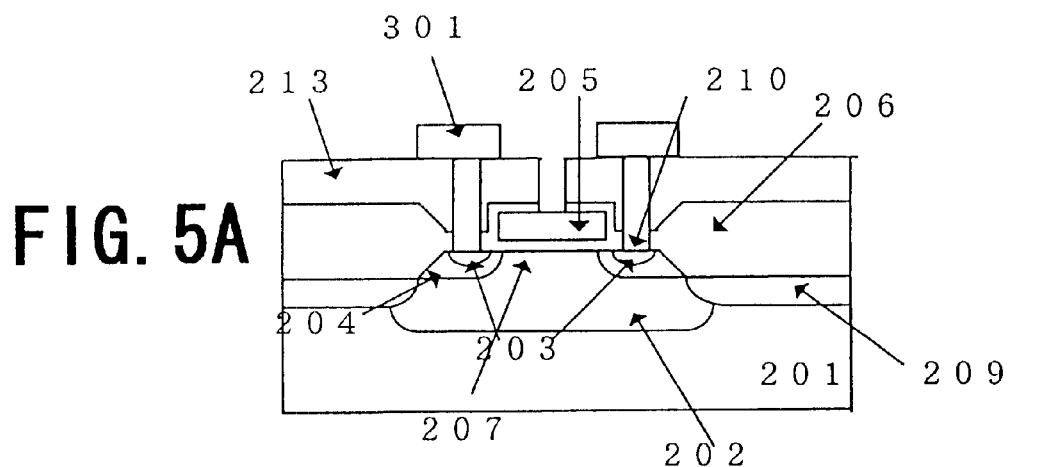
FIGS. 5A and 5B are cross-sectional views illustrating another steps of a method of manufacturing the P-channel MOS transistor shown in the first example of the semiconductor device according to the present invention.
Figure 5B:
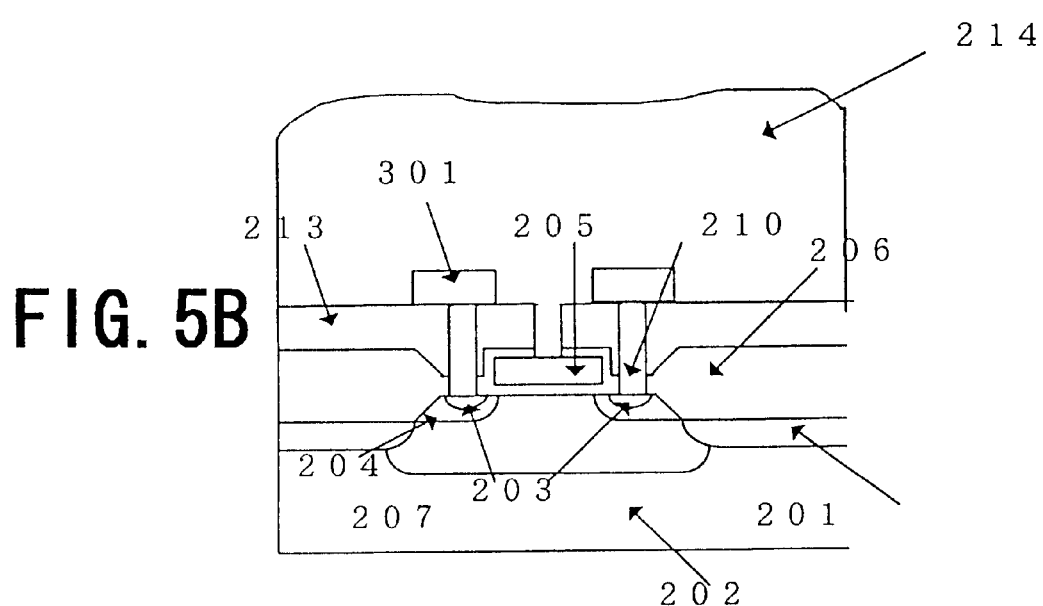

FIGS. 5A and 5B are cross-sectional views showing another steps of a method of manufacturing a P-channel MOS transistor in the first example of the semiconductor device according to the present invention.

In this method, the same steps as those shown in FIGS. 4A to 4F are conducted. Thereafter, as shown in FIG. 5A, the diffusion layers 204 of low concentration for a P-channel MOS transistor are formed, and a photoresist is removed. Then, for example, the BPSG interlayer film 213 is formed over the entire surface. The interlayer film 213 is formed, for example, by a CVD method, and is flattened by heat treatment at 900° C. to 950° C. for 30 minutes to 2 hours. Subsequently, the interlayer film 213 is selectively etched to form the contact holes 210 in the diffusion regions 204 of low concentration and the gate electrode 205. According to the present invention, the contact holes are formed by round etching (dry etching followed by wet etching). In this state, polycrystalline silicon is formed over the entire surface, for example, by a CVD method and made into a P-type. Impurity elements (boron or BF2) are implanted at high concentration into the polycrystalline silicon by ion implantation or by using an impurity diffusion furnace. The implantation concentration is set to be an ion implantation/polycrystalline silicon thickness=2E19 atoms/$cm^3$ or more. Thereafter, a patterned polycrystalline silicon wiring 301 is formed by photolithography and etching. Then, heat treatment is conducted so as to diffuse impurities from the polycrystalline silicon to the surface of the substrate and to improve the shape of the contact holes. According to the present invention, the heat treatment is conducted at 800° C. to 1050° C. within 3 minutes. The diffusion regions 203 of high concentration are formed by self-alignment using the contact holes 210 as a mask.

Then, as shown in FIG. 5B, a metal material is formed over the entire surface by vacuum evaporation or sputtering. Thereafter, the patterned metal wiring 212 is formed by photolithography and etching. Finally, the entire surface of the resultant substrate is covered with the surface protective film 214.

The example of the P-channel MOS transistor has been exemplified in the above. Even when an N-channel MOS transistor is formed by using impurities of reverse conductivity, similar effects are obtained.

EXAMPLE 2

Figure 6:
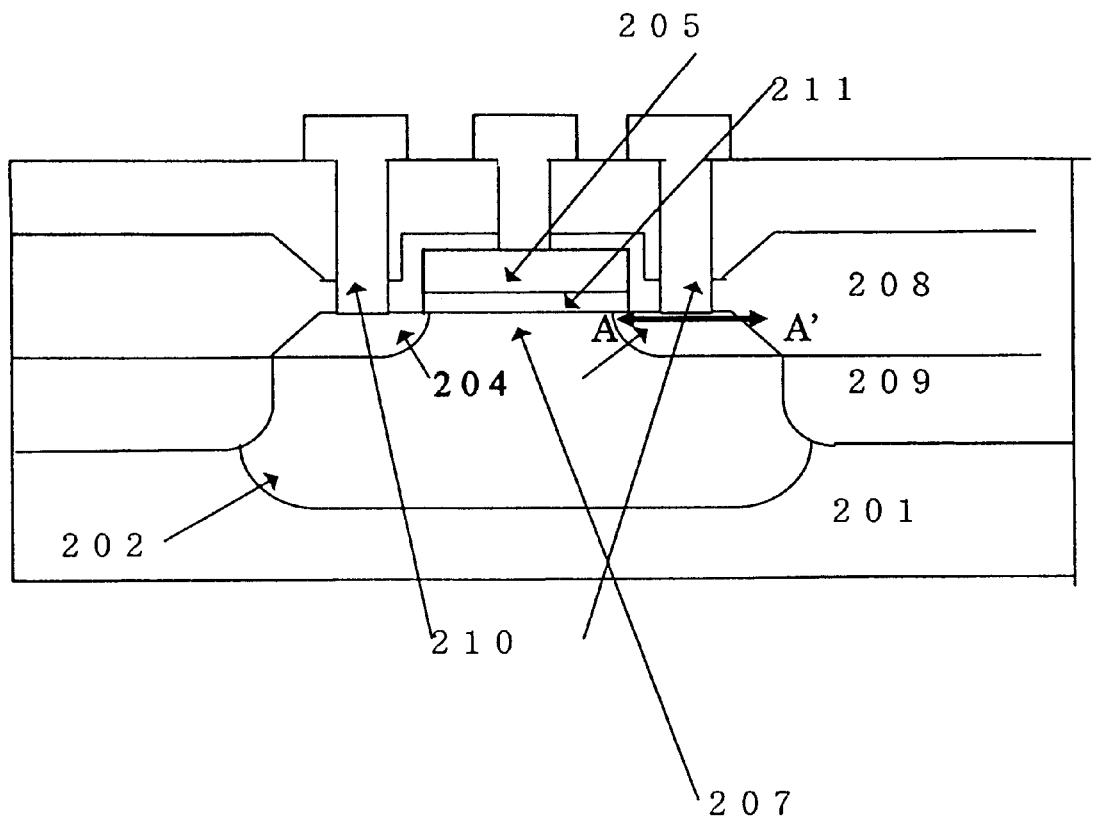
FIG. 6 is a schematic cross-sectional view of a P-channel MOS transistor, showing the second example of a semiconductor device according to the present invention.

The second example of a semiconductor device according to the present invention will be described in detail. FIG. 6 is a schematic cross-sectional view of a P-channel MOS transistor having a medium withstand voltage structure of the semiconductor device according to the present invention.

The P-channel MOS transistor is composed of a gate oxide film 211 and a polycrystalline silicon gate electrode 205 formed on an N-type well region 202 in a P-type silicon semiconductor substrate 201, regions where impurities are implanted and regions where impurities are not implanted in the surface of the substrate 201 on both sides of the gate electrode 205, and P-type diffusion layers 204 and a channel region 207 therebetween formed by heat treatment. In order to provide isolation of the elements, field oxide films 208 and channel stop regions 209 are formed. It is not necessarily required to form an N-type well region by using a P-type silicon semiconductor substrate. A P-channel MOS transistor may be formed in an N-type silicon semiconductor substrate.

Furthermore, an N-channel MOS transistor of reverse conductivity is composed of, a P-type well region formed in an N-type silicon semiconductor substrate, a gate oxide film and a polycrystalline silicon gate electrode formed on the P-type well region, regions where impurities are implanted and regions where impurities are not implanted in the surface of the silicon substrate on both sides of the gate electrode, and N-type diffusion layers and a channel region therebetween formed by heat treatment. In order to provide isolation of the elements, field oxide films and channel stop regions are formed. It is not necessarily required to use an N-type silicon semiconductor substrate. An N-channel MOS transistor may be formed by using a P-type silicon semiconductor substrate.

In the same way as in the first example, in the second example, by controlling the width of the low concentration diffusion region and the concentration thereof in accordance with a required drain withstand voltage, a junction withstand voltage between the source/drain region and the channel stop region under the field oxide film, and an overlap capacitance between the source/drain region and the gate electrode, a MOS transistor suitable for high integration and high speed can be obtained. Furthermore, a plurality of MOS transistors having different withstand voltages can be easily formed on the identical substrate without increasing the number of masks to be used.

Figure 7A:
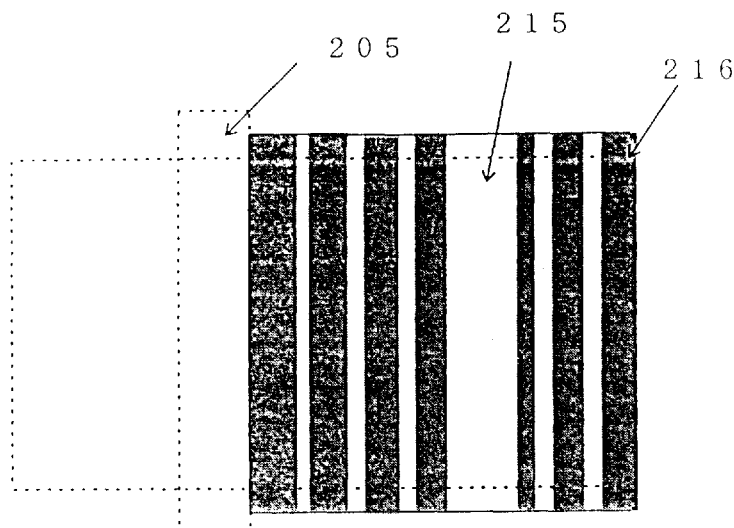
FIGS. 7A to 7C are schematic plane views each showing the shape of a region in which impurities are implanted and that of a region in which impurities are not implanted in the P-channel MOS transistor in the second example of the semiconductor device according to the present invention.
Figure 7B:
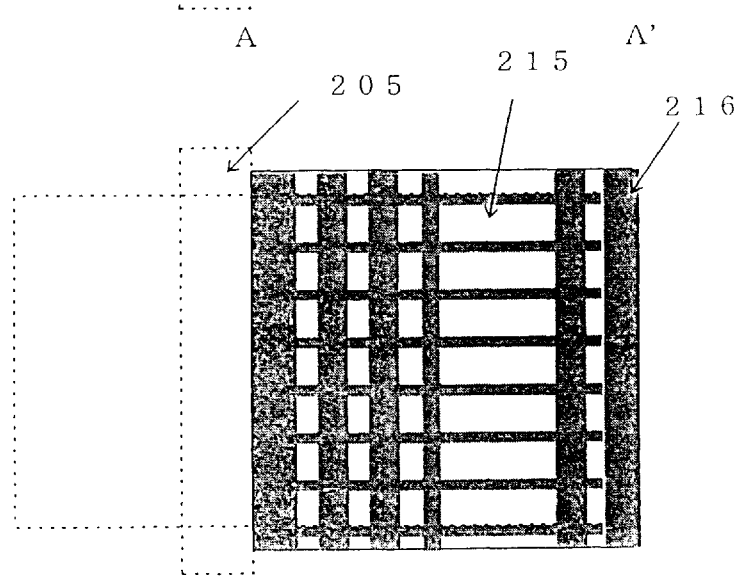
Figure 7C:
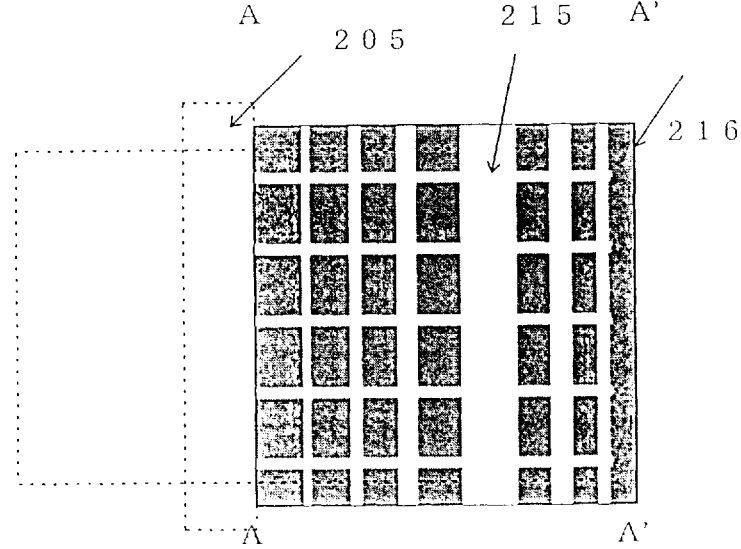

FIGS. 7A to 7C are schematic plan views showing the shapes of regions where impurities are implanted and regions where impurities are not implanted in the P-channel MOS transistor in the second example of the semiconductor device according to the present invention.

In FIG. 7A, regions where impurities are implanted and regions where impurities are not implanted are formed in a stripe shape. The width and interval of the regions where impurities are implanted are varied depending upon a required on-resistance, a hot electron resistance, a capacitance between the source/drain region and the substrate, an overlap capacitance between the source/drain region and the gate electrode, and a junction withstand voltage between the source/drain region and the channel stop region under the field oxide film, whereby the concentration thereof is controlled. Furthermore, in FIG. 7B, regions where impurities are implanted are formed in a dot shape. The size and interval of dots of the regions where impurities are implanted are varied depending upon required characteristics. Furthermore, in FIG. 7C, regions where impurities are implanted are formed in a grid shape. The width and interval of the grid of the regions where impurities are implanted are varied depending upon required characteristics, in the same way as in the other structure.

Figure 8:
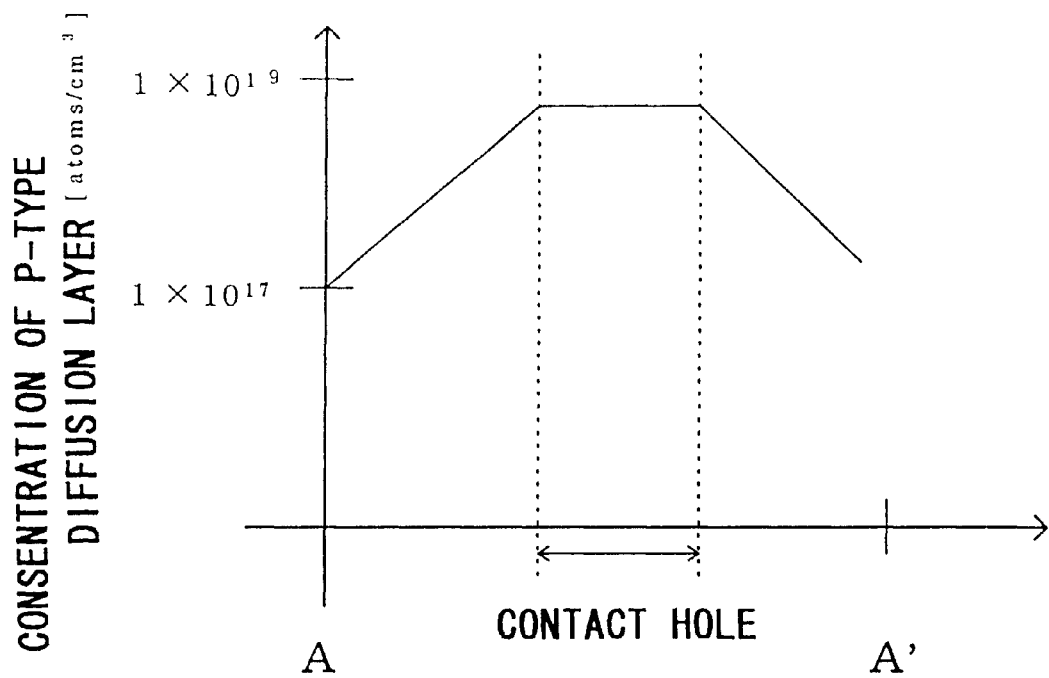
FIG. 8 shows a concentration profile A–A' of the P-type diffusion layer, in the case where regions for implanting impurities and regions for implanting no impurities are formed in a stripe shape as shown in FIG. 7A at a dose amount of 5E15 atoms/cm$^2$, in the P-channel MOS transistor having a medium withstand voltage structure of the semiconductor device according to the present invention in FIG. 6.

FIG. 8 shows a concentration profile A–A' of the P-type diffusion layer, in the case where regions for implanting impurities and regions for implanting no impurities are formed in a stripe shape as shown in FIG. 7A at a dose amount of 5E15 atoms/cm$^2$, in the P-channel MOS transistor having a medium withstand voltage structure of the semiconductor device according to the present invention in FIG. 6.

As is apparent from FIG. 8, the concentration profile of the P-type diffusion layer can be easily varied by changing regions where impurities are implanted and regions where impurities are not implanted. More specifically, by controlling the concentration in the diffusion layer by changing regions where impurities are implanted and regions where impurities are not implanted, in accordance with a required drain withstand voltage, an on-resistance, a hot electron resistance, a capacitance between the source/drain region and the substrate, an overlap capacitance between the source/drain region and the gate electrode, and a junction withstand voltage between the source/drain region and the channel stop region under the field oxide film, a MOS transistor suitable for high integration and a high-speed can be obtained. This will be exemplified with reference to FIG. 9.

Figure 9:
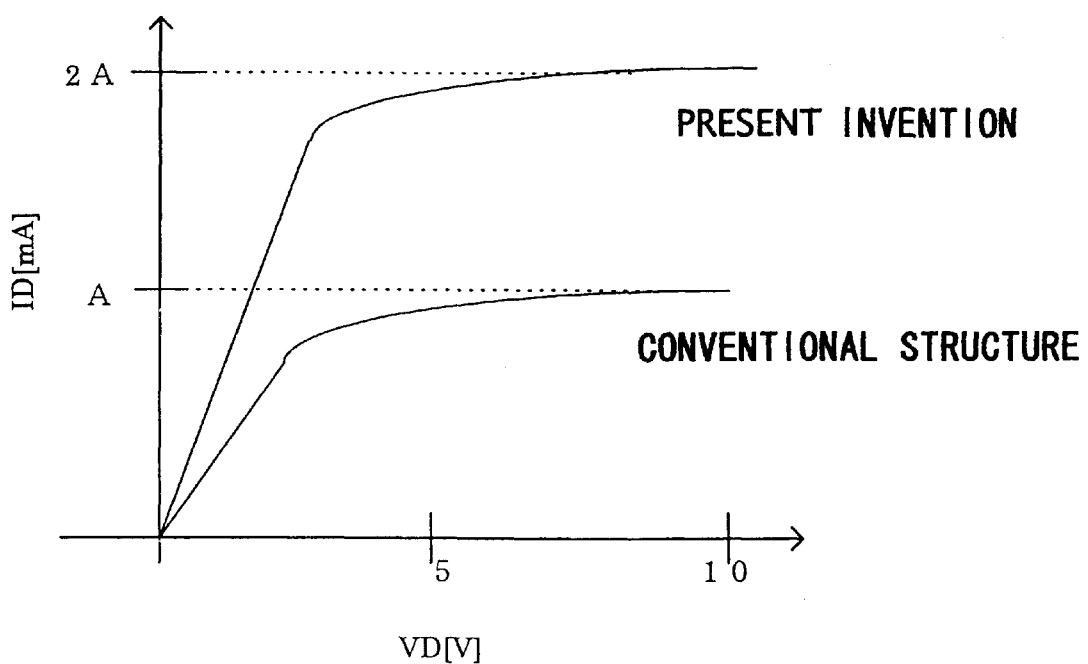
FIG. 9 shows a relationship between the drain current in the conventional structure and the drain current in the structure according to the present invention, in the case where regions for implanting impurities and regions for implanting no impurities in the drain and source regions of a P-channel MOS transistor having a medium withstand voltage structure of the semiconductor device according to the present invention shown in FIG. 6 are formed in a stripe shape at a dose amount of 2.5E12 atoms/cm$^2$ by ion implantation.

FIG. 9 shows a relationship between the drain current in the structure according to the present invention in which regions for implanting impurities and regions for implanting no impurities in the drain and source regions are formed in a stripe shape at a dose amount of 2.5E12 atoms/cm$^2$ by ion implantation, and the drain current in the conventional structure.

It is understood from FIG. 9 that an on-resistance is considerably decreased according to the present invention since a larger current flows according to the present invention compared with the conventional structure. Furthermore, by changing the concentration of the low concentration region and the high concentration region, a drain withstand voltage, an on-resistance, a hot electron resistance, a capacitance between the source/drain region and the substrate, an overlap capacitance between the source/drain region and the gate electrode, and a junction withstand voltage between the source/drain region and the channel stop region under the field oxide film can be easily changed.

FIGS. 10A to 10H are cross-sectional views showing the steps of a method of manufacturing a P-channel MOS transistor in the second example of the semiconductor device according to the present invention.

Figure 10A:
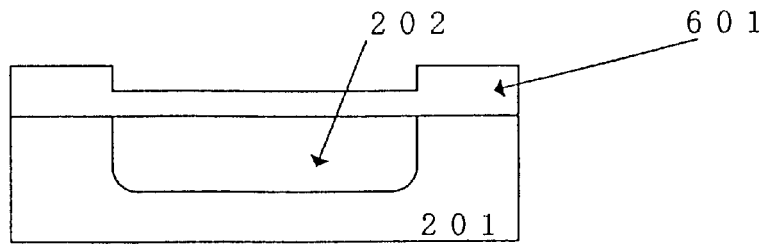
FIGS. 10A to 10H are cross-sectional views illustrating the steps of manufacturing the P-channel MOS transistor shown in the second example of the semiconductor device according to the present invention.

In the step shown in FIG. 10A, an N-type well layer 202 is formed on the surface of a P-type silicon semiconductor substrate 201. First, a silicon nitride film 601 patterned to a predetermined shape is formed as a mask on the surface of the substrate 201, and then, N-type impurities (e.g., phosphorus) are ion-implanted at a dose amount of 2E12 atoms/cm$^2$. Thereafter, so-called LOCOS processing is conducted to remove the silicon nitride film 601 formed in the previous step. Then, the resultant substrate 201 is subjected to heat treatment at 1150° C. for 6 hours, whereby the implanted phosphorus impurities are diffused and activated to form the N-type well layer 202 as shown in FIG. 10A. A P-channel MOS transistor will be formed in the N-type well layer 202. It is not necessarily required to use a P-type silicon semiconductor substrate. It may also be possible that an N-type well region is formed by using an N-type silicon semiconductor substrate, and a P-channel MOS transistor is formed in the N-type well region. Alternatively, a P-channel MOS transistor may be formed in an N-type silicon semiconductor substrate.

Figure 10B:
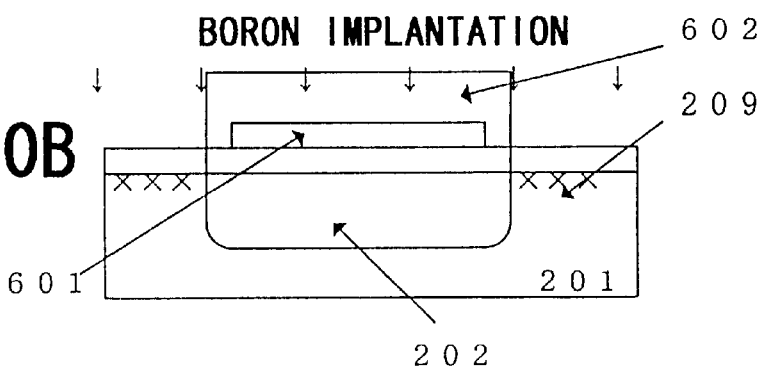

In the step shown in FIG. 10B, channel stop regions 209 are formed. First, a silicon nitride film 601 is patterned so as to cover an active region where a transistor element is to be formed. On the N-type well layer 202, a photoresist 602 as well as the silicon nitride film 601 are stacked on top of the other. In this state, impurities (boron) are ion-implanted at an acceleration energy of 30 keV and a dose amount of 2E13 atoms/cm$^2$ thereby forming the channel stop regions 209. As shown in FIG. 10B, the channel stop regions 209 are formed in portions including an element region.

Figure 10C:
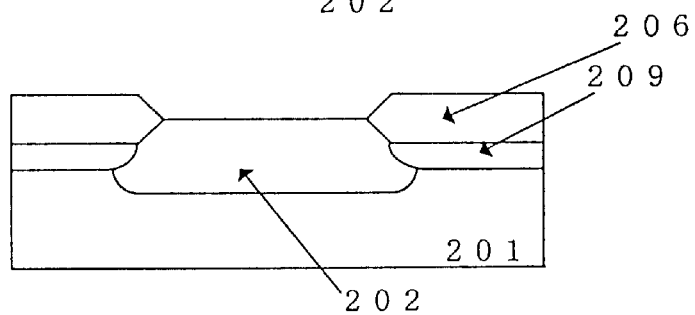

Subsequently, as shown in FIG. 10C, so-called LOCOS processing is conducted to form field oxide films 206 so as to surround the element region. Thereafter, sacrificing oxidation and removal processing are conducted, whereby foreign matter remaining on the surface of the substrate is removed for cleaning.

Figure 10D:
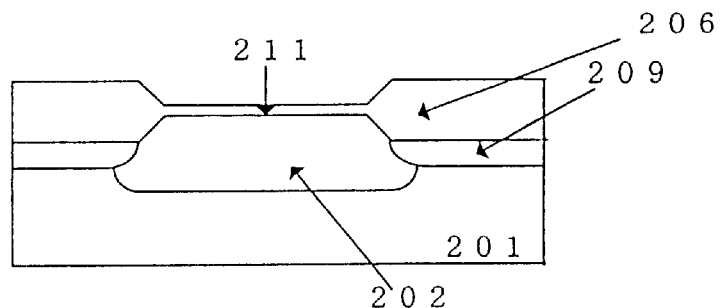

In the step shown in FIG. 10D, a gate oxide film 211 is formed in a H$_2$O atmosphere by thermal oxidation processing of the surface of the resultant substrate 201. According to the present invention, thermal oxidation processing is conducted in a H$_2$O atmosphere at 860° C. to form the gate oxide film 211 with a thickness of about 300 Å. In general, in order to ensure the reliability of a semiconductor device, the thickness of a gate insulating film formed of a thermal oxide film needs to be set at about 3 MV/cm. For example, a MOS transistor with a supply voltage of 30 volts requires an oxide film with a thickness of 1000 Å or more.

Figure 10E:
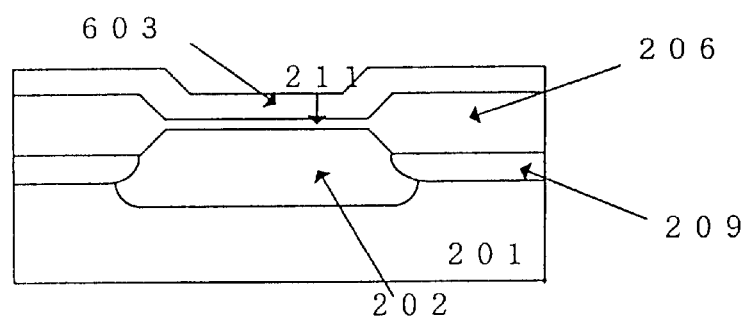

Then, as shown in FIG. 10E, polycrystalline silicon 603 is deposited on the gate oxide film 211 by a CVD method. According to the present invention, polycrystalline silicon with a thickness of 4000 Å is formed. In order to form a gate electrode 205 for a MOS transistor, the polycrystalline silicon 603 is made into an N-type. Impurity elements (phosphorus) are implanted at high concentration into the polycrystalline silicon 603 by ion implantation or by using an impurity diffusion furnace. The implantation concentration is set to be ion implantation/polycrystalline silicon thickness=2E19 atoms/cm$^3$ or more. The gate electrode for a MOS transistor is not necessarily required to be made into an N-type. It may be possible that impurity elements (boron) are implanted at high concentration by ion implantation or by using an impurity diffusion furnace, whereby the gate electrode is made into a P-type.

Figure 10F:
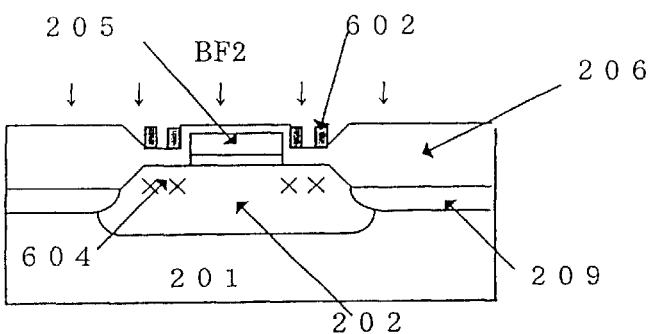

Then, as shown in FIG. 10F, the photoresist formed in the previous step is removed, and in this state, P-type impurities (BF2 or boron) are ion-implanted into the surface of the semiconductor substrate at a dose amount of $1\times\times10^{12}$ to $5\times10^{16}$ atoms/cm$^2$ (this corresponds to a concentration of $1\times10^{16}$ to $1\times10^{20}$ atoms/cm$^3$) by using, as a mask, a photoresist patterned into regions for implanting impurities and regions for implanting no impurities, whereby diffusion layers 604 of drain and source regions of a P-type MOS transistor are formed. By single ion implantation, two or more regions of different impurity concentrations are simultaneously formed. Thereafter, in order to smoothen the concentration profile of the drain and source regions, heat treatment is conducted.

Figure 10G:
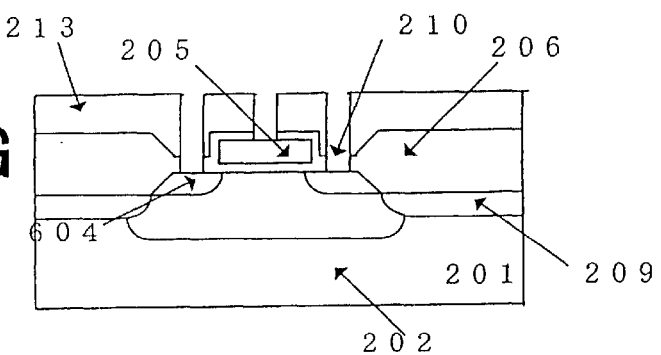

As shown in FIG. 10G, after the diffusion layers 604 of low concentration for the P-channel MOS transistor are formed and the photoresist is removed, for example, a BPSG interlayer film 213 is formed over the entire surface. The interlayer film 213 is formed, for example, by a CVD method, and then flattened by heat treatment at 900° C. to 950° C. for about 30 minutes to 2 hours. Subsequently, the interlayer film 213 is selectively etched to form contact holes 210 in the diffusion regions 604 of low concentration and the gate electrode 205. According to the present invention, the contact holes are formed by round etching (dry etching followed by wet etching). Thereafter, heat treatment is conducted so as to activate the implanted impurities and to improve the shape of the contact holes. According to the present invention, the heat treatment is conducted at 800° C. to 1050° C. within 3 minutes.

Figure 10H:
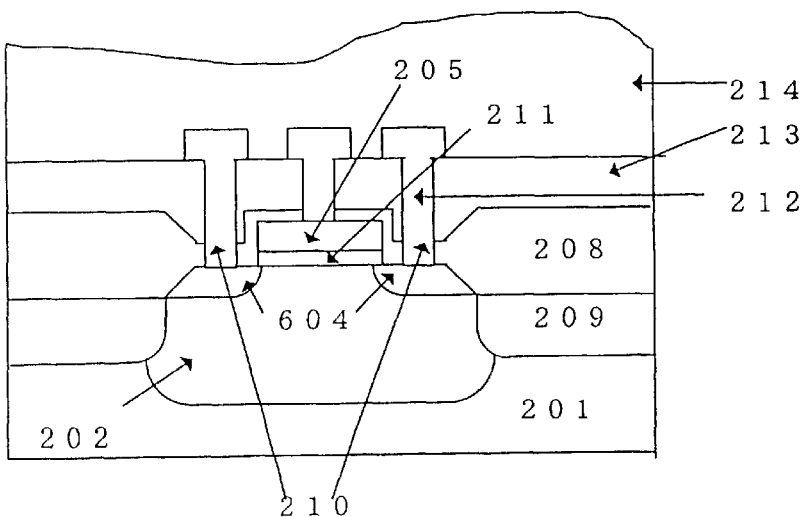
Figure 11:
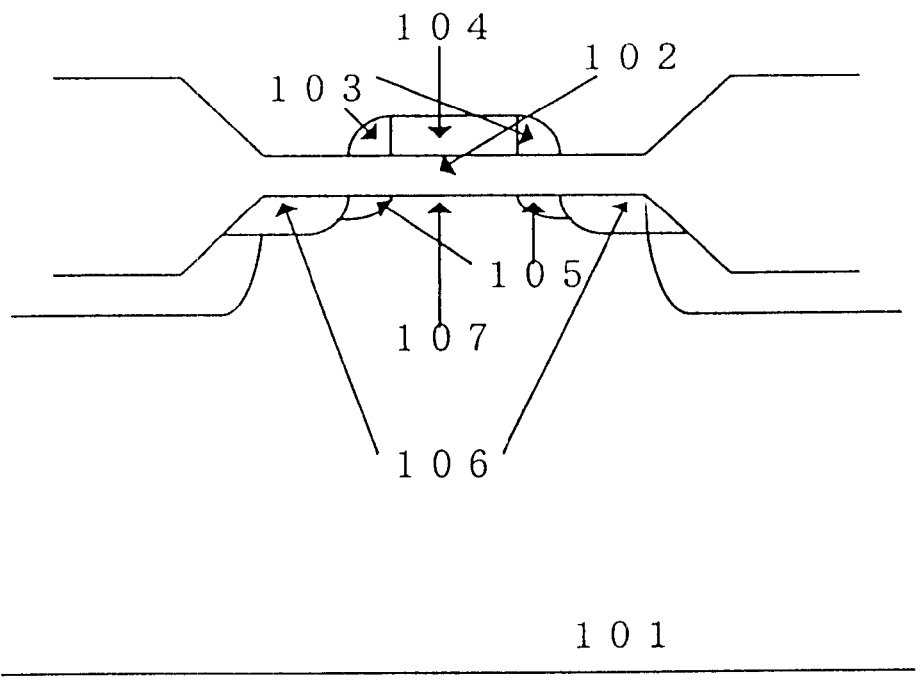
FIG. 11 is a final cross-sectional view of a MOS transistor manufactured by a conventional production method.

Then, as shown in FIG. 10H, a metal material is formed over the entire surface by vacuum evaporation or sputtering. Thereafter, a patterned metal wiring 212 is formed by photolithography and etching. Finally, the entire surface of the resultant substrate is covered with a surface protective film 214.

The example of the P-channel MOS transistor has been exemplified in the above. Even when an N-channel MOS transistor is formed by using impurities of reverse conductivity, similar effects are obtained.

As described above, according to the present invention, a MOS transistor satisfying a requirement of an operation in a medium withstand voltage range (8 to 30 volts) can be provided by a simple process. In this transistor, high concentration diffusion regions are formed by ion implantation, using contact holes as a mask, whereby the distance between one end of a contact hole and one end of a gate electrode, and the distance between one end of a contact hole and one end of a field oxide film can be easily changed. Because of this, unlike a conventional MOS transistor having an LDD structure, the MOS transistor of the present invention has a high drain withstand voltage (the drain withstand voltage can be controlled), a small overlap capacitance between the source/drain region and the gate electrode, and a high junction withstand voltage between the source/drain region and the channel stop region under a field oxide film, and a plurality of MOS transistors having different withstand voltages can be formed on the identical substrate without increasing the number of masks.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device having one or more MOS transistors, each MOS transistor comprising:

a field oxide film formed on a semiconductor substrate having a first conductivity type;

a channel stop region having the first conductivity type formed in the semiconductor substrate under the field oxide film;

a gate insulating film formed on the semiconductor substrate;

a gate electrode formed on the gate insulating film low impurity concentration source and drain regions of a second conductivity type opposite the first conductivity type formed in the semiconductor substrate surrounded by the field oxide film and the gate electrode;

an interlayer insulating film for electrically insulating the gate electrode and the source and drain regions;

a wiring layer formed on the interlayer insulating film;

a pair of contact holes extending through the interlayer insulating film to expose a portion of the source and drain regions for electrically connecting the wiring layer, the gate electrode, and the source and drain regions; and a high impurity concentration diffusion layer of the second conductivity type formed only in the exposed portion of each of the source and drain regions.

2. A semiconductor device according to claim 1; wherein an impurity concentration of the low impurity concentration source and drain regions is in the range of 1E16 to 1E18 atoms/cm$^3$.

3. A semiconductor device according to claim 1; wherein an impurity concentration of the high impurity concentration diffusion layer is in the range of 1E19 to 5E20 atoms/cm$^3$.

4. A semiconductor device according to claim 1; wherein a plurality of the MOS transistors are formed on the semiconductor substrate each having a different withstand voltage, the different withstand voltages being set by varying a width of the source and drain regions by changing a distance between one end of the gate electrode and one end of each diffusion layer.

5. A semiconductor device according to claim 1; wherein the low impurity concentration source and drain regions are formed by ion-implanting impurities into the surface of the semiconductor substrate using the gate electrode as a mask; and the high concentration diffusion layers are formed by ion-implanting impurities into the surface of the semiconductor substrate using the contact hole as a mask.

6. A semiconductor device according to claim 1; wherein the interlayer insulating film is a BPSG film.

7. A semiconductor device having one or more MOS transistors, each comprising:
   a field oxide film formed on a semiconductor substrate having a first conductivity type;
   a channel stop region having the first conductivity type formed in the semiconductor substrate under the field oxide film;
   a gate insulating film formed on the semiconductor substrate;
   a gate electrode formed on the gate insulating film;
   a channel region formed under the gate electrode;
   low impurity concentration source and drain regions of a second conductivity type opposite the first conductivity type formed in the semiconductor substrate surrounded by the field oxide film and the gate electrode;
   an interlayer insulating film for electrically insulating the gate electrode and the source and drain regions;
   a wiring layer formed on the interlayer insulating film;
   a pair of contact holes extending through the interlayer insulating film for electrically connecting the wiring layer, the gate electrode, and the source and drain regions; and
   high impurity concentration source and drain regions having an impurity concentration within the range of 1E19 to 5E20 atoms/cm$^3$ of the second conductivity type formed under the contact holes and separated from the channel region and the channel stop region;
   wherein the high and low impurity concentration source and drain regions are formed with regions in which impurities are implanted and regions in which no impurities are implanted so that impurity concentration profiles thereof may be varied by varying a relationship between the regions in which the impurities are implanted and the regions in which no impurities are implanted.

8. A semiconductor device according to claim 7; wherein an impurity concentration of the low impurity concentration source and drain regions is in the range of 1E16 to 5E20 atoms/cm$^3$.

9. A semiconductor device according to claim 7; wherein the regions where impurities are implanted and the regions where impurities are not implanted are formed in a dot shape.

10. A semiconductor device according to claim 7; wherein the regions where impurities are implanted and the regions where impurities are not implanted are formed in a grid shape.

11. A semiconductor device according to claim 7; wherein the regions where impurities are implanted and the regions where impurities are not implanted are formed in a stripe shape.

12. A semiconductor device according to claim 7; wherein the regions where impurities are implanted and the regions where impurities are not implanted are formed by implanting ions into the surface of the semiconductor substrate by using a patterned photoresist mask, followed by conducting a heat treatment, to thereby simultaneously form at least two regions of different impurity concentrations.

13. A semiconductor device according to claim 12; wherein the interlayer insulating film is a BPSG film.

14. A MOS transistor comprising: a semiconductor substrate having a first conductivity type; a gate insulating film formed on the semiconductor substrate; a gate electrode formed on the gate insulating film; low impurity concentration source and drain regions of a second conductivity type opposite the first conductivity type formed in the semiconductor substrate adjacent the gate electrode; an interlayer insulating film for electrically insulating the gate electrode and the source and drain regions; a wiring layer formed on the interlayer insulating film; contact holes extending through the interlayer insulating film to expose a portion of the source and drain regions for electrically connecting the wiring layer, the gate electrode, and the source and drain regions; and high impurity concentration diffusion regions having an impurity concentration of the second conductivity type formed only in the exposed portion of each of the source and drain regions.

15. A MOS transistor according to claim 14; further comprising a field oxide film formed on the semiconductor substrate.

16. A MOS transistor according to claim 15; further comprising a channel stop region formed in the semiconductor substrate under the field oxide film.

17. A MOS transistor according to claim 14; wherein an impurity concentration of the low impurity concentration source and drain regions is in the range of 1E16 to 1E18 atoms/cm$^3$.

18. A MOS transistor according to claim 14; wherein an impurity concentration of the high impurity concentration diffusion layer is in the range of 1E19 to 5E20 atoms/cm$^3$.

19. A MOS transistor according to claim 18; wherein the interlayer insulating film is a BPSG film.

20. A MOS transistor according to claim 14; wherein the low impurity concentration source and drain regions comprise a plurality of regions having different impurity concentrations so that concentration profile of the source and drain regions may be arbitrarily varied by changing a relationship between the regions having different impurity concentrations.

* * * * *